(12) United States Patent
Toros et al.

(10) Patent No.: US 6,970,382 B2
(45) Date of Patent: *Nov. 29, 2005

(54) SYSTEM AND METHOD FOR CONTROLLING LOGICAL VALUE AND INTEGRITY OF DATA IN MEMORY SYSTEMS

(75) Inventors: Zeynep Toros, Irvine, CA (US); Esin Terzioglu, Aliso Viejo, CA (US); Ahmad O. Siksek, Irvine, CA (US); Gil I. Winograd, Aliso Viejo, CA (US); Ali Anvar, Lake Forest, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 11/024,560

(22) Filed: Dec. 29, 2004

(65) Prior Publication Data

US 2005/0111277 A1    May 26, 2005

Related U.S. Application Data

(63) Continuation of application No. 10/365,913, filed on Feb. 13, 2003, now Pat. No. 6,842,379.

(51) Int. Cl.[7] ............................................. G11C 16/34
(52) U.S. Cl. ..................... 365/185.22; 365/185.21; 365/185.19; 365/185.03
(58) Field of Search ..................... 365/185.03, 185.22, 365/185.19, 185.21, 185.18

(56) References Cited

U.S. PATENT DOCUMENTS

| | | | |
|---|---|---|---|
| 5,508,971 A | 4/1996 | Cernea et al. | 365/185.23 |
| 5,926,409 A | 7/1999 | Engh et al. | 365/45 |
| 6,052,306 A | 4/2000 | Sedlak et al. | 365/185.19 |
| 6,166,962 A | 12/2000 | Chen et al. | 365/185.3 |
| 6,301,151 B1 | 10/2001 | Engh et al. | 365/185.03 |
| 6,335,881 B2 | 1/2002 | Kim et al. | 365/185.18 |
| 6,842,379 B2 * | 1/2005 | Toros et al. | 365/185.22 |
| 2004/0145947 A1 * | 7/2004 | Micheloni et al. | 365/185.19 |

* cited by examiner

Primary Examiner—Andrew Q. Tran
(74) Attorney, Agent, or Firm—McAndrews, Held & Malloy, Ltd.

(57) ABSTRACT

In a digital memory system, systems and methods that control a logical value and an integrity of data represented by charge are provided. In one embodiment, a bit line is coupled to the cell. A voltage generator is arranged to generate a plurality of cell operating voltages varying in response to a voltage control signal. A controller generates a control signal, stores a predetermined one of logical values in a cell by generating a series of operating voltages, transmits the series of operating voltages, and determines whether the predetermined one of the logical values has been stored in the cell in response to a voltage on the bit line. The controller includes a charge integrity estimating module and determines whether the predetermined one of the logical values has been stored in the cell by initiating the operation of the charge integrity estimating module.

25 Claims, 5 Drawing Sheets

SYSTEM AND METHOD FOR CONTROLLING LOGICAL VALUE AND INTEGRITY OF DATA IN MEMORY SYSTEMS

CROSS-REFERENCE TO RELATED APPLICATIONS

This application is a continuation of U.S. application Ser. No. 10/365,913 filed Feb. 13, 2003, now U.S. Pat. No. 6,842,379 which is hereby incorporated herein by reference in its entirety.

BACKGROUND OF THE INVENTION

This invention relates to memory cells and more particularly relates to control of non-volatile memory cells.

Non-volatile memory cells maintain their contents without the need for an external power supply. In comparison, SRAM, DRAM or other memory technologies lose their contents when the power is switched off. An internal battery is sometimes used to mimic non-volatile memory with SRAM or DRAM; however, an internal battery installation is expensive and cannot guarantee proper operation over long periods of time. It is highly desirable to store certain data, such as boot-up code, chip ID, chip self-repair information, etc., in a non-volatile memory.

The application of non-volatile memory has been hindered by a lack of adequate controls for such memory. Some types of non-volatile memory are degraded over time by the application of excessive voltages. In a memory that uses a verify procedure, voltages necessary to program, erase and verify require repeated application of such voltages. Thus, there is a need for non-volatile memory control that provides increased cell reliability without complicating use of the memory for a user. This invention addresses these needs and provides a solution.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

One apparatus embodiment of the invention is useful in a digital memory system including a memory cell arranged to store charge corresponding to first logical value when the quantity of stored charge lies within a first range of values and corresponding to a second logical value when the quantity of stored charges lies within a second range of values. The cell is arranged to store a predetermined one of the first and second logical values in response to a range of operating voltages received by the cell. In such an environment, the logical value and the integrity of the data represented by the charge can be controlled by apparatus comprising a bit line coupled to the cell. A voltage generator is arranged to generate a plurality of cell operating voltages varying from a first voltage to a second voltage in response to a voltage control signal. The first voltage is lower in value than the second voltage. A controller is arranged to generate the control signal and is arranged to store a predetermined one of the logical values in the cell by generating a series of the operating voltages beginning with the first voltage and continuing with successively larger operating voltages greater the first voltage. The controller transmits to the cell from the voltage generator the series of operating voltages. After each transmittal of one of the series of operating voltages, the controller causes at least a portion of the charge to flow in the bit line and determines whether the predetermined one of the logical values has been stored in the cell in response to the flow of charge. The controller terminates transmittal of the series of operating voltages to the cell in the event that the predetermined one of the logical states has been stored or in the event that one of the series of successively larger operating voltages equals the second voltage.

One method embodiment of the invention is useful in a digital memory system including a memory cell arranged to store charge corresponding to a first logical value when the quantity of stored charge lies within a first range of values and corresponding to a second logical value when the quantity of stored charges lies within a second range of values. The cell is arranged to store a predetermined one of the first and second logical values in response to a range of operating voltages received by the cell. In such an environment, the logical value and integrity of the data represented by the charge can be controlled by a method comprising generating a plurality of cell operating voltages varying from a first voltage to a second voltage in response to a voltage control signal, the first voltage being lower in value than the second voltage. A predetermined one of the logical values is stored in the cell by generating a series of the operating voltages beginning with the first voltage and continuing with successively larger operating voltages greater the first voltage. The series of operating voltages is transmitted to the cell. After each transmittal of one of the series of operating voltages, it then is determined whether the predetermined one of the logical values has been stored in the cell. The transmittal of the series of operating voltages to the cell is terminated in the event that the predetermined one of the logical states has been stored or in the event that one of the series of successively larger operating voltages equals the second voltage.

By using the foregoing techniques, charge may be adjusted in a non-volatile memory with a degree of economy, ease of fabrication, ease of use and reliability previously unattained.

These and other advantages and novel features of the present invention, as well as details of an illustrated embodiment thereof, will be more fully understood from the following description and drawings.

DETAILED DESCRIPTION OF THE INVENTION

Figure 1:
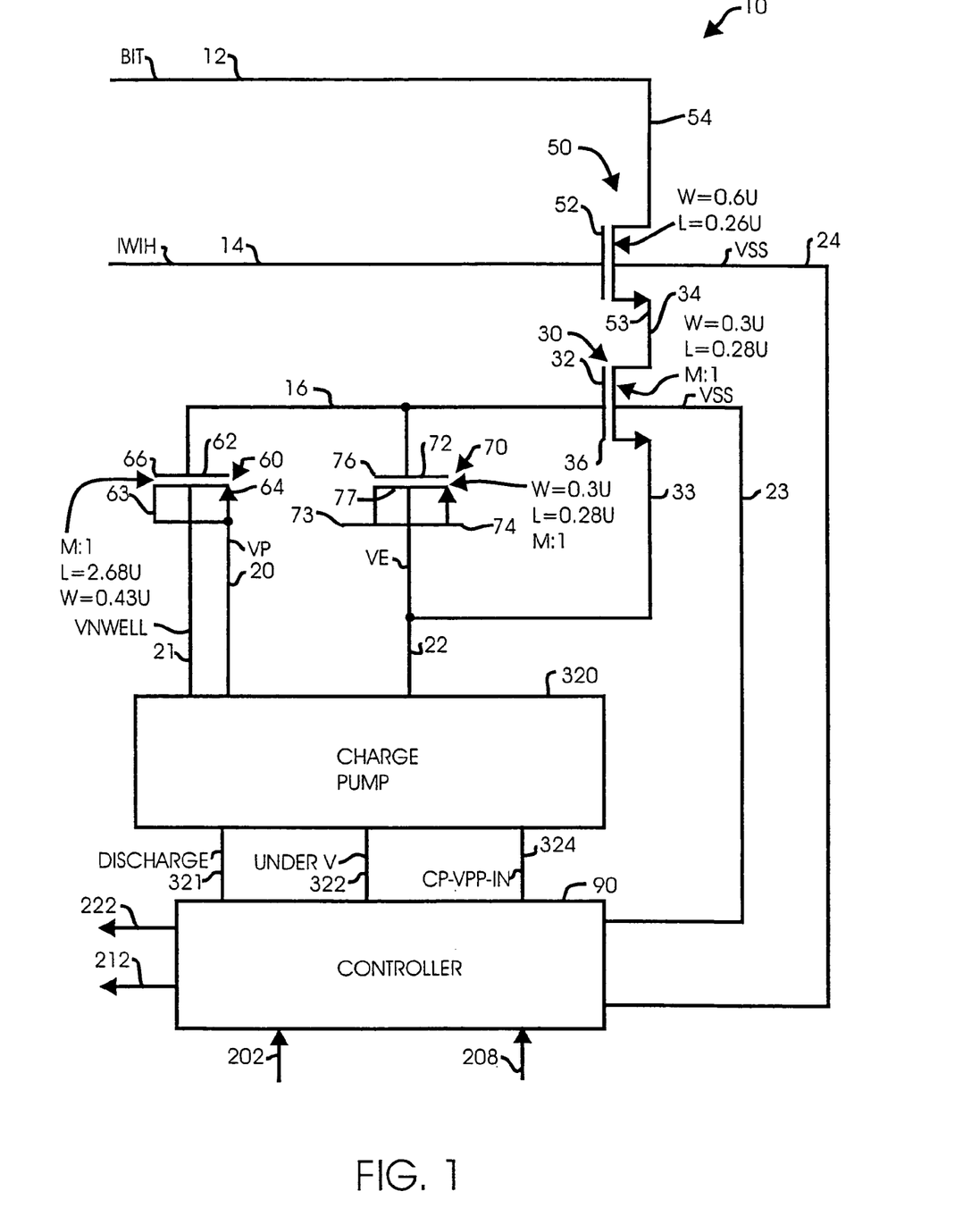
FIG. 1 is a schematic diagram of an exemplary memory cell employing PMOS and NMOS transistors, together with an exemplary controller and charge pump, suitable for use with the invention.
Figure 8:
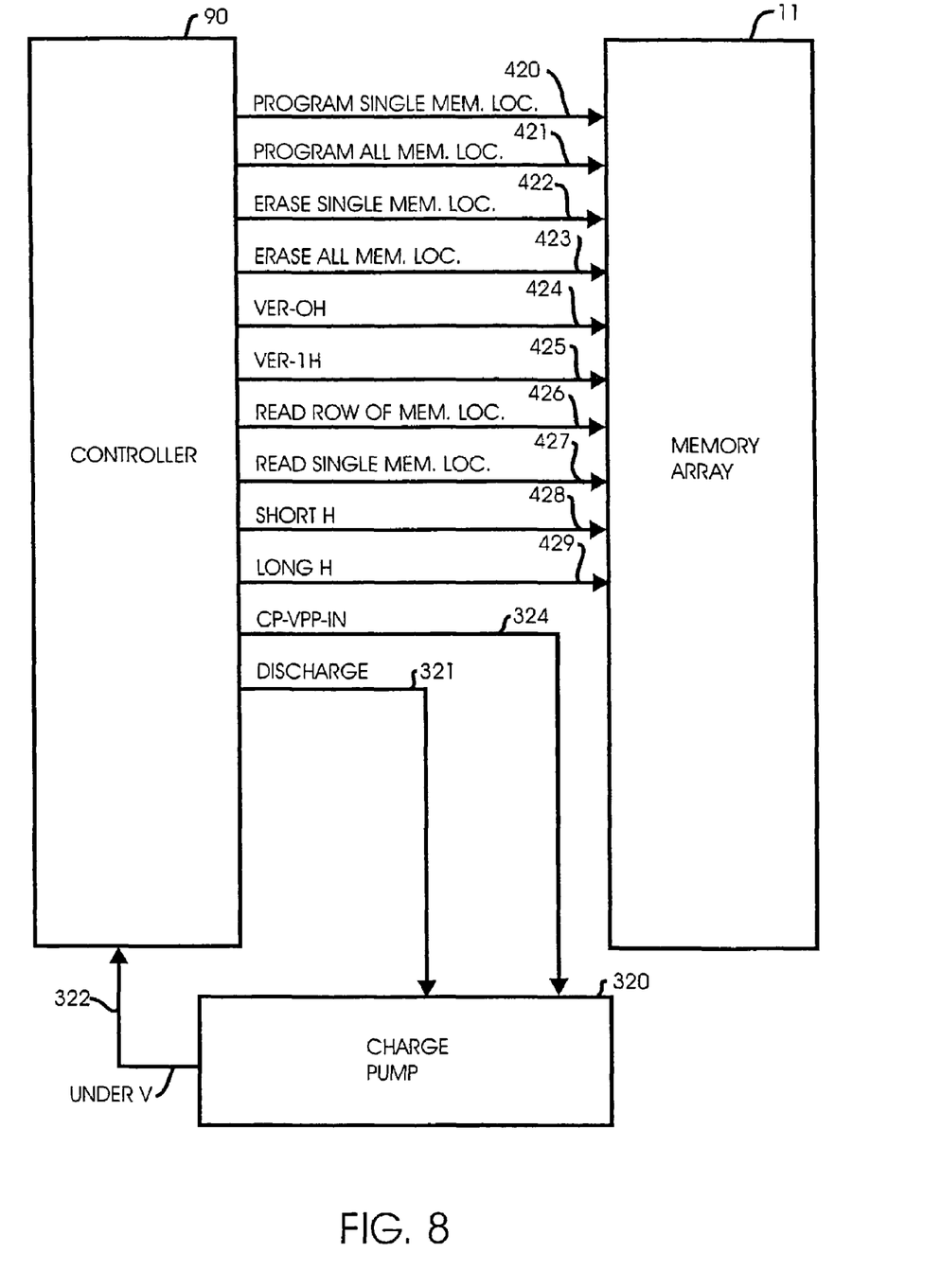
FIG. 8 is a schematic block diagram of one embodiment of the invention.

FIG. 8 illustrates an exemplary non-volatile memory array 11 that includes rows and columns of memory cells, such as cell 10 shown in FIG. 1. Many functions of array 11 are conducted by a controller 90, which also controls a charge pump 320.

A signal on a path 420 enables the programming of a single memory location or cell within array 11. A signal on a path 421 enables the programming of all memory locations or cells within array 11. Programming is carried as described in connection with FIG. 2.

A signal on a path 423 enables the erasing of a single memory location or cell within array 11, and a signal on a path 424 enables the erasing of all memory locations or cells within array 11. Erasing is carried as described in connection with FIG. 1.

Verification of logical values may be carried by Ver-0H and Ver-1H signals on paths 424 and 425, respectively, as described in connection with FIG. 4.

An entire row of locations or cells within array 11 is read by a signal on a path 426. The reading of a single memory location or cell within array 11 is carried by a signal on a path 427.

The integration time during a verification operation is varied by Short H and Long H signals on paths 428 and 429, respectively. Integration time is explained in connection with FIGS. 6 and 7.

The cp_vpp_in, discharge, and under v signals on paths 324, 321 and 322, respectively, are described in connection with FIG. 5.

An individual cell 10 of array 11 is described in connection with FIG. 1.

FIG. 1 illustrates an exemplary non-volatile memory cell 10 that is coupled to a bit line 12 and a word line 14. The cell includes a node 16 that comprises a conductive material, such as metal or polysilicon, as well as various sources of reference voltages 20–24. The cell is part of a digital memory system 15 that includes the structure shown in FIGS. 1–4.

Figure 3:
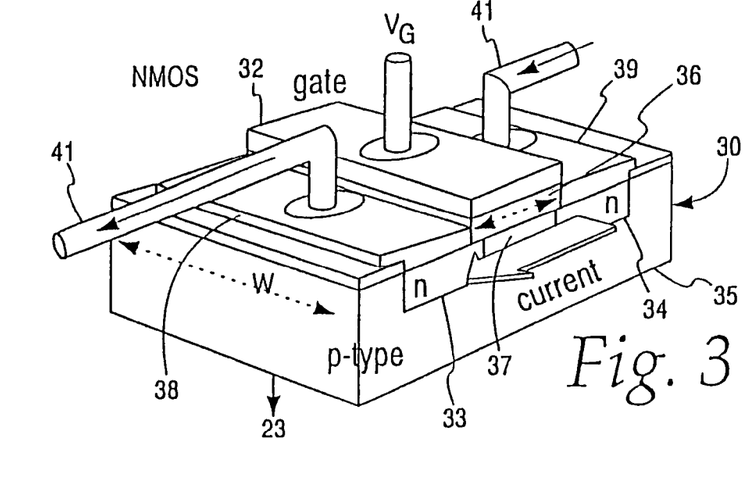
FIG. 3 is a schematic diagram of the NMOS transistors shown in FIG. 1.

Referring to FIGS. 1 and 3, an NMOS field effect transistor 30 comprises a gate 32, a source 33, a drain 34, a substrate 35 and an electrically insulating oxide layer 36 that is capacitively coupled between node 16 and a voltage source 22. The source and drain are n type material and the substrate is p type material. The source and drain are separated by a channel region 37. Electrodes 38 and 39 connect the source and drain in a current path 41 that extends from bit line 12 to voltage source 22. Substrate 35 is connected to a voltage source 23. Source 33 is connected to a source of voltage 22.

Another NMOS field effect transistor 50 is constructed like transistor 30. Transistor 50 includes a gate 52 that is connected to word line 14, a drain 54 that is connected to bit line 12 and a source 53 that is connected to drain 34. Source 53 and drain 54 are connected in path 41.

Figure 2:
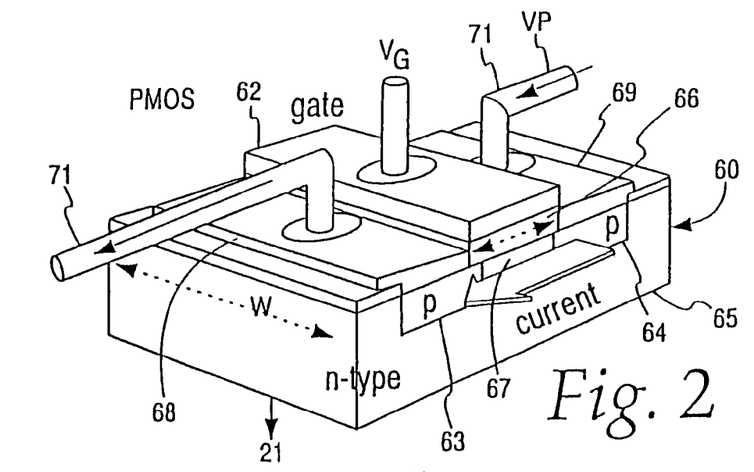
FIG. 2 is a schematic diagram of the PMOS transistors shown in FIG. 1.

Referring to FIGS. 1 and 2, a PMOS transistor 60 includes a gate 62 connected to node 16, a source 63, a drain 64, a substrate 65 and an electrically insulating oxide layer 66 that is capacitively coupled between node 16 and voltage sources 20–21. The source and drain are p type material and the substrate is n type material. The source and drain are separated by a channel region 67. Electrodes 68 and 69 connect the source and drain in a current path 71. Voltage source 20 is connected to the source and drain, and voltage source 21 is connected to substrate 65.

Another PMOS field effect transistor 70 is constructed like transistor 60. Transistor 70 includes a gate 72 that is connected to node 16, and includes a source 73, a drain 74 and a substrate 75 that are connected to voltage source 22. A channel region 77 separates the source and drain. An electrically insulating tunneling oxide layer 76 is located under gate 72 and is capacitively coupled between node 16 and voltage source 22. The area of layer 76 is smaller than the area of layer 66. Typically, the area of layer 76 is 5% or less of the area of layer 66. In addition, the surface area of transistor 70 (i.e., the surface area of the source, drain and channel) is smaller than the surface area of transistor 60 (i.e., the surface area of the source, drain and channel). Typically, the surface area of transistor 70 is 5% or less of the surface area of transistor 60.

The sources, drains, channel areas and substrates of each of transistors 30, 50, 60 and 70 are fabricated from semiconductor materials.

For the cells shown in FIG. 1, planar structures are used to couple to the charge storage node 16. Taking advantage of advanced fabrication processes, field assisted tunneling is used to modulate the charge stored on node 16. Other forms of cell 10 are described in U.S. application Ser. No. 10/151, 981, filed May 21, 2002, in the names of Esin Terzioglu et al., which is incorporated in its entirety into this application. Beside each of the transistors shown in FIG. 1, the length of the transistor is indicated by L, the width of the transistor is indicated by W, and the multiple of the transistor is indicated by m. The letter U indicates a micron.

Still referring to FIG. 1, node 16 is a floating charge storage node whose potential is varied by modulating the charge stored on node 16. Transistor 60 is a large PMOS device that is used to modify the potential at node 16 by capacitive coupling.

Logical values stored in the memory array can be erased and programmed in separate modes of operation. Erase and programming operations on occasion may require maximum operating voltages in the range of 4.25 volts, and the use of maximum operating voltages tend to result in threshold shift and device performance degradation over time. In order to reduce such performance degradation, one embodiment of the invention employs a series of operating voltages that begin with a low value and increase the value if necessary, until a value sufficient to carry out a reliable erase or programming operation is found. Thus, in most cases, an operating voltage below the maximum operating voltage is used, thereby reducing performance degradation.

A controller 90 determines the voltage of sources 20–24 during various modes of operation by controlling the operation of a voltage generator in the form of a charge pump 320. Voltages Vp, Ve and Vnwell are generated by charge pump 320, which is controlled by controller 90. The controller provides the inputs to the charge pump to generate voltages Vp, Ve and Vnwell. During an erase operation that removes charge from node 16, electrons are extracted from node 16 by raising terminal 22 to one or more of a series of operating voltages that increase in value. The operating voltages are generated by charge pump 320 on one or more of lines 20–22 and are transmitted to cell 10 by controller 90. Transistor 70 is small relative to transistor 60, and transistor 70 therefore forms a small portion of the capacitance at node 16 (e.g., the capacitance of node 16 supplied by transistor 70 is much smaller than the capacitance of node 16 supplied by transistor 60). Therefore, most of the applied source 22 voltage is dropped across the oxide layer 76 of transistor 70. Electron extraction from node 16 is achieved when the positive potential at source 22 attracts electrons from node 16 and causes them to tunnel through oxide layer 76. During an erase operation, controller 90 typically causes the voltages of sources 20–24 to be switched to one or more of a series of voltages. Vp, source 20, is approximately 0 volts; Vnwell, source 21, is tied to Vp, source 20; Ve, source 22, is set to a series of one or more operating voltages that begin at a low value and may increase step-by-step to a maximum of approximately 4.25 volts; and VSS, nodes 23–24, are approximately 0 volts.

Electrons are injected into floating node 16 during a programming operation by setting terminals 20–21 to one or more of a series of operating voltages that increase in value. The operating voltages are generated by charge pump 320 one or more of lines 20–22. Terminals 20–21 can be tied together in a typical cell. Since transistor 60 forms the majority of the capacitance at node 16, only a small amount of the applied source 20–21 voltage is dropped across the oxide layer 66 of transistor 60. In other words, the percentage of source 20–21 voltage dropped across layer 66 is much lower than the percentage of source 22 voltage dropped across layer 76. As a result, due to the operation of transistor 60, the potential of node 16 rises significantly when voltage is applied from sources 20–21. Since the voltage of source 22 is kept at zero potential during a programming operation, a potential develops across the oxide layer 76 in the opposite direction of the erase operation. The voltage across layer 76 attracts electrons into the floating node by a field assisted tunneling mechanism.

Cells like cell 10 typically are organized in an array of cells. For the cells in such a memory array that are not to be programmed, the voltage sources like source 22 are biased to half the source 22 program voltage so as not to cause any disturbance. During a programming operation, controller 90 typically causes the voltages of sources 20–24 to be switched to the following values: Vp, source 20, is set to one or more of a series of step-by-step operating voltages that may increase to a maximum of 4.25 volts; Vnwell, source 21, is tied to Vp, source 20; Ve, source 22, is approximately 0 volts; and VSS, nodes 23–24 are approximately 0 volts. If no program is desired for the cell, then Ve, source 22, is approximately 2 volts.

Still referring to FIG. 1, transistors 30 and 50 are used to read data from cell 10. Erase and programming operations on occasion may require maximum operating voltages in the range of 4.25 volts, and the use of maximum operating voltages tend to result in threshold shift and device performance degradation over time. The read operation is accomplished by precharging bitline 12, by raising the voltage of word line 14, by connecting line 22 to ground potential, and by raising the voltages of sources 20–21 to typical chip voltages, such as approximately 1.2 volts in 0.13 micrometer technology. If the potential of node 16 is high enough (e.g., when cell 10 is erased), transistor 30 is switched on. If transistor 50 also is switched on, a current flow in path 41 causes the potential of bit line 12 to decrease. If the potential of node 16 is low (e.g., cell 10 is programmed and net negative charge is present on node 16), transistor 30 is not switched on, and no current flows in path 41 so that the voltage on bit line 12 remains high.

An alternative embodiment of the cell shown in FIG. 1 is to switch the order of transistors 30 and 50. The source of transistor 30 may be exposed to sufficient voltage during an erase operation to cause some device characteristics to shift over time. By moving transistor 30 to the position of transistor 50, and connecting the source of transistor 50 to ground, this damage can be minimized.

Figure 4:
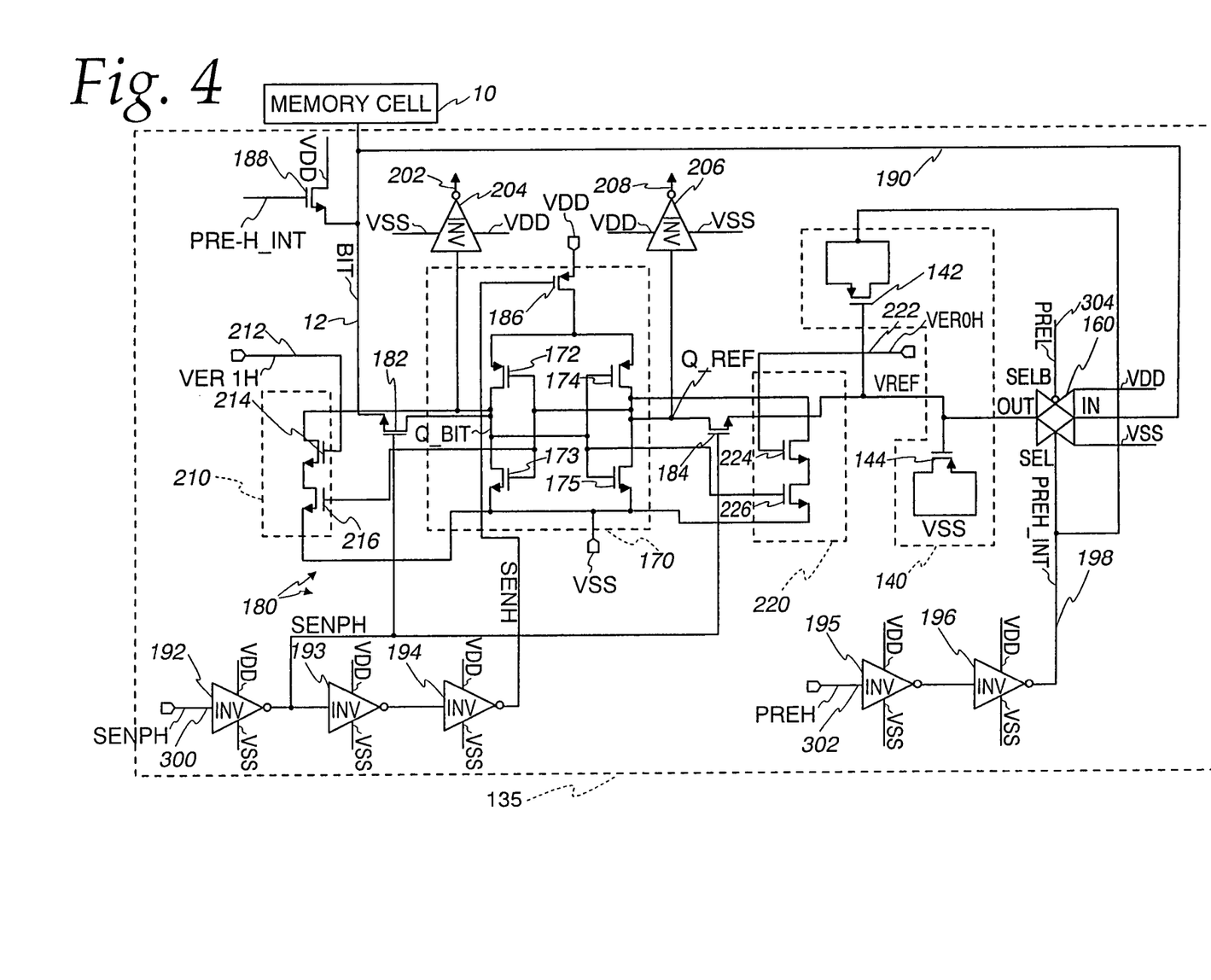
FIG. 4 is a schematic diagram of an exemplary memory cell integrity estimating module suitable for use with the invention.

FIG. 4 illustrates a charge integrity estimating module 135 that cooperates with bit line 12 and memory cell 10. Module 135 may be considered a part of controller 90. Cell 10 is arranged to store charge corresponding to first logical value when the quantity of stored charge lies within a first range of values and corresponding to a second logical value when the quantity of stored charges lies within a second range of values. For example, the first range of values may correspond to a logical 0 and the second range of values may correspond to a logical 1.

Module 135 includes a single-ended sense amplifier that has a built-in reference voltage generator 140 with noise suppression capability. Single-ended bit line 12 is sampled and held by a transfer gate 160 at the same time the bit line is floated or precharged (in anticipation of the integration time when the memory cell 10 is connected to the floating bit line). If there is noise on the bit line, the sampled reference voltage includes this noise, and it thus becomes common mode (i.e., ignored by differential sense amplifier 170). The sampled voltage stored in transfer gate 160 is then increased for a pull-up sense amplifier (or decreased for a pull-down sense amplifier) by a fixed fraction of the supply voltage by a capacitive divider circuit, such as transistor capacitors 142 and 144, to form a reference voltage. This reference voltage is used by differential pull-up type sense amplifier 170.

Still referring to FIG. 4, transistors 172–175 form a cross-coupled pair of transistors for differential sense amplifier 170.

A control circuit 180 of module 135 includes access transistors 182 and 184 that couple bit line 12 and reference voltage generator 140 to the internal nodes of sense amplifier 170. When the sense amplifier is energized, transistors 182 and 184 turn off, isolating the internal nodes of amplifier 170. A transistor 186 determines when amplifier 170 is energized by coupling to a supply voltage VDD. A transistor 188 precharges bit line 12 to 0 volts. Bit line 12 is coupled to the q_bit node of sense amplifier 170 by transistor 182. Bit line 12 also is coupled to transfer gate 160 over a path 190.

Control circuit 180 also includes inverters 192–196. During a read operation, at the moment the precharge transistor 188 is turned off, (when the preH_int signal becomes zero), transfer gate 160 also is turned off, thereby isolating bit line 12 from voltage generator 140. At the same time, the source/drain nodes of transistor 142 are pulled low, coupling the Vref node down by a fixed fraction of the supply voltage VDD in order to generate the reference voltage for amplifier 170 on node Vref. The fraction is determined by the relative capacitance of transistor 142 and the node capacitance at node Vref, which includes the capacitance of transistor 144. The node Vref capacitance can be adjusted by changing the size of transistor 144, which is connected to a fixed voltage VDD.

During a read operation, after reference voltage generator 140 has generated the reference voltage on node Vref, the voltage on bit line 12 is transferred to node q_bit in amplifier 170 through transistor 182. The time when the word line goes high begins an integration period. The duration of the integration period id is controlled by the shortH/longH signals generated by controller 90. At the end of the integration period, the senpH signal is pulled high. As a result, transistors 182 and 184 are turned off after one inverter delay resulting from inverter 192. After two more inverter delays caused by inverters 193–194, sense amplifier 170 is energized when transistor 186 is turned on. After being energized, sense amplifier 170 compares the values at q_ref and q_bit to determine the amount of charge stored in memory cell 10, which determines the logical value stored in cell 10.

In one embodiment, module 135 also includes a transistor stack 210 comprising transistors 214 and 216 that are coupled to transistor pair 172–173 as shown, and a transistor stack 220 comprising transistors 224 and 226 that are coupled to transistor pair 174–175 as shown. Stacks 210 and 220 place a load on sense amplifier 170 when activated.

As a result of the foregoing circuitry, amplifier 170 generates on a path 202 an output voltage responsive to the voltage on bit line 12 and the reference voltage. The output voltage passes through an inverter 204. A reference voltage output is transmitted through an inverter 206 to an output path 208.

Inverter 206 is present to make the sense amplifier 170 load symmetric.

The embodiment shown in FIG. 4 addresses any disturbance event that is specifically caused during power-on state of the memory array.

Memory cell 52 has two verify modes: "verify 0" and "verify 1". "Verify 0" reads a stored word with the sense margin for a "0" (little or not negative charge stored on node 16) decreased by a given amount (designed into the sense amplifier 170). "Verify 1" reads a stored word with the sense margin for a "1" (a range of substantial negative charge stored on noe 16) decreased by a given amount. In one embodiment, the shifts in sense margins are achieved by electrically skewing the sense amplifier 170 cross coupled pair 172–175 with stacks 210 and 220. In another embodiment, stacks 210 and 220 are not used. Instead, the shifts in sense margins are achieved by varying the integration time during the first, second and third modes of operation.

First a bit to be verified is read in the normal read mode and the stored data is detected to be a 0 or a 1. If the data disturbance is so severe that there are failures even during the normal read mode, the corruption is unrecoverable. However, the refresh circuits used with most memory arrays continually scan memory cell 10 and fix disturbances so that data corruption is avoided. After the data is read and noted, if the bit is a 0, the bit is verified with the "verify 0" mode. Another read operation is issued to memory cell 10, this time with the "verify 0" mode asserted. The stored bit is now read with a reduced sense margin for 0's. If there are any failures on the expected 0's in the bit, the location is erased more to enforce the weakly stored data.

If the bit is a 1, a "verify 1" cycle is similarly applied to the memory this time with the "verify 1" mode asserted. Any failures during the "verify 1" operation are re-enforced by re-programming the failing bit at the given location. Erase-verify for 0's and program-verify for 1's are repeated until there are no more failures in the normal read and verify read modes for all bits. The effects of power-on disturbances on the non-volatile storage cell are thus eliminated effecting an indefinite retention time as long as the power is on.

The architecture of module 135 allows single word program and erase operations (with the input data determining which bits in the word are to be programmed or erased). During a single-word erase operation, only the bits of the accessed word that correspond to input data 0 are erased. During a single-word program operation, only the bits of the accessed word that correspond to input data 1 are programmed.

Module 135 is continually testing the memory incorporating cell 10 and is verifying each word of the memory. If a word fails a verify operation, that word is erased to fix any failing 0's and is programmed to fix any failing 1's. During the refresh operations, access to the memory is blocked. If this blocking is not desirable, various caching techniques can be used to minimize direct access to the non-volatile memory.

Data verification is accomplished with the following steps:

(i) During a first mode of operation, read the location to be verified (e.g., memory cell 10) in the normal read mode and detect whether the data is a 0 or a 1.

(ii) During a second mode of operation, if a 0 was detected, read the location to be verified (e.g., memory cell 10) with "verify 0" mode asserted.

(iii) Compare the 0's in the data from normal read mode to those in the data from "verify 0" mode.

(iv) If there are any mismatches between the two, erase the 0's in the location and re-verify until all match with 0's from the normal read mode.

(v) During a third mode of operation, if a 1 was detected, read the location to be verified (e.g., memory cell 10) with the "verify 1" mode asserted.

(vi) Compare the 1's in the data from normal read mode to those in the data from "verify 1" mode.

(vii) If there are any mismatches between the two, program the 1's in the location and reverify until all match with 1's from the normal read mode.

(viii) If refresh erase/program has been performed, apply "verify 0" and "verify 1" after everything has been refreshed to make sure the location is clean.

In the first embodiment, transistor stacks 210 and 220 are added in parallel with the cross coupled sensing nmos pair 172–175. These stacks can be turned on with the ver0H signal (verify 0 mode) and ver1H signal (verify 1 mode). When the verify 0 signal is asserted, sense amplifier 170 is skewed due to the physical size difference in the active cross coupled pair. Similarly, when the verify 1 signal is asserted, the sense amplifier is skewed in the other direction making the margin requirement for sensing a 1 smaller. The end result can be thought of moving the reference voltage (Vref) higher or lower during the verify operations. Instead of a fixed reference value, there is a voltage reference "band" within which no cells can reside (otherwise these cells will be "flagged" during verify operations).

In a second embodiment, stacks 210 and 220 are not used. Instead, the integration time is varied during the first, second and third modes of operation.

Figure 6:
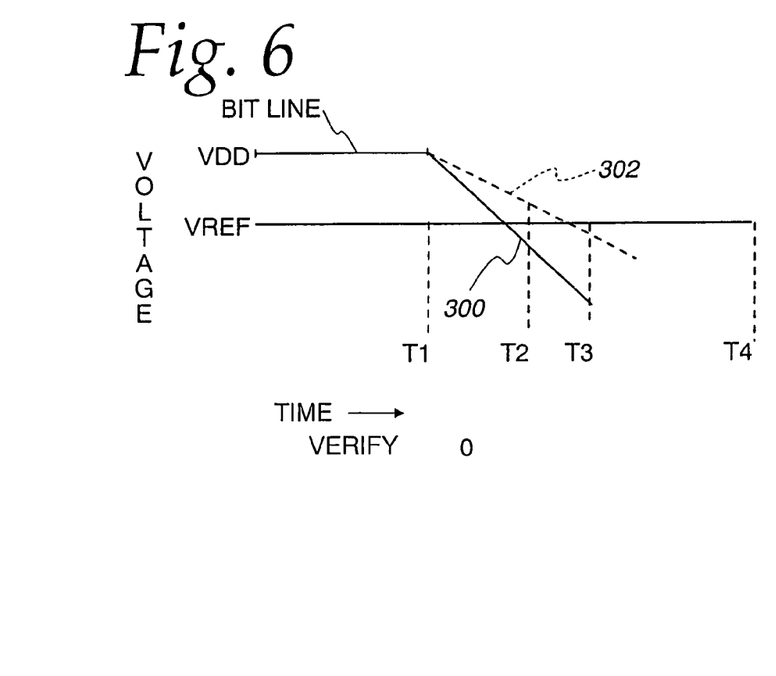
FIG. 6 is a graph showing voltages during a verify 0 mode of operation.

The operation for the verify 0 mode of operation is explained with reference to FIG. 6. As previously explained, the verify 0 mode of operation is entered if during the first mode of operation, a read cycle determines that cell 10 stores a 0 (little or no negative charge). The integration time during the read cycle is shown as the time period between times T1 and T3. During the verify 0 mode, prior to time T1, bit line 12 is precharged to VDD, and VREF is generated as previously explained. At time T1, controller 90 causes word line 14 to go high, thereby turning on transistor 52 (FIG. 1). Controller 90 also supplies ground potential to supply 22 at time T1. If node 16 stores no charge, transistor 32 is turned on hard, and the voltage on bit line 12 rapidly decays to values below VREF at both times T2 and T3 as shown by exemplary decay line 300. The bit line voltage is compared with VREF by sense amplifier 170, and the negative relationship can be detected by controller 90 at both times T2 and T3.

However, if a small amount of charge is stored on node 16 (but still within the range indicating a 0 value), at time T1, transistor 32 (FIG. 1) will turn on less hard, and the voltage on bit line 12 will follow an exemplary decay line 302. If the bit line voltage were compared with VREF at the end of the read integration time, T3, the bit line voltage would be negative with respect to VREF, thereby giving no indication that some charge had leaked onto node 16. To avoid this result, the bit line voltage is compared with VREF at time T2 during the verify 0 mode of operation. The compare time is controlled by signal short H of controller 90 (FIG. 8). At time T2, the bit line voltage is greater than VREF, thereby indicating that node 16 needs to be erased. In summary, during the verify 0 mode of operation, the integration time of bit line 12 is reduced from time T3 to time T2.

Figure 7:
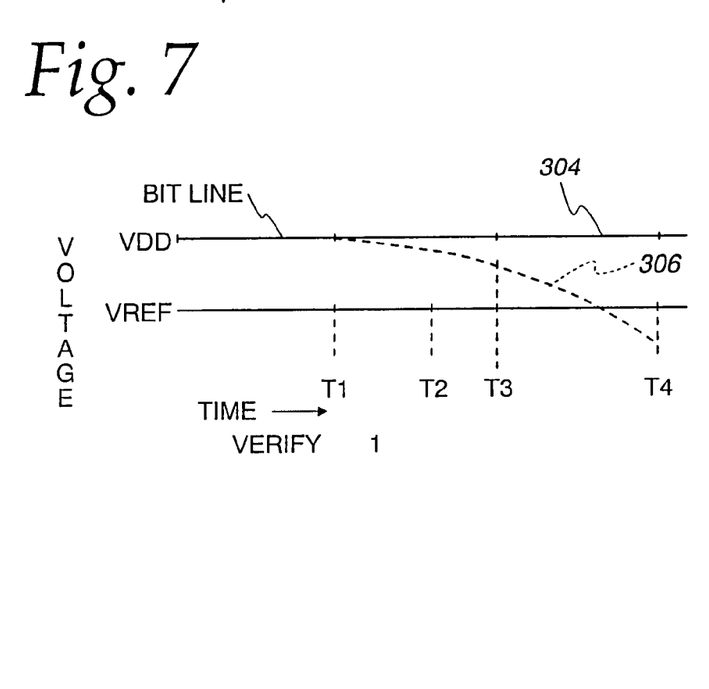
FIG. 7 is a graph showing voltages during a verify 0 mode of operation.

The operation for the verify 1 mode of operation is explained with reference to FIG. 7. As previously explained, the verify 1 mode of operation is entered if during the first mode of operation, a read cycle determines that cell 10 stores a 1 (a substantial amount of negative charge). The integration time during the read cycle is shown as the time period between times T1 and T3. During the verify 1 mode, prior to time T1, bit line 12 is precharged to VDD, and VREF is generated as previously explained. At time T1, controller 90 causes word line 14 to go high, thereby turning on transistor 52 (FIG. 1). Controller 90 also supplies ground potential to supply 22 at time T1. If node 16 stores substantial charge, transistor 32 is turned off hard, and the voltage on bit line 12 remains substantially at value VDD at both times T3 and T4 as shown by exemplary decay line 304. The bit line voltage is compared with VREF by sense amplifier 70, and the positive relationship can be detected by controller 90 at both times T3 and T4.

However, if some charge has leaked from node 16 (but the amount of charge stored is still within the range indicating a 1 value), at time T1, transistor 32 (FIG. 1) will turn on to some extent, and the voltage on bit line 12 will follow an exemplary decay line 306. If the bit line voltage were compared with VREF at the end of the read integration time, T3, the bit line voltage would be positive with respect to VREF, thereby giving no indication that some charge had leaked from node 16. To avoid this result, the bit line voltage is compared with VREF at time T4. At time T4, the bit line voltage is less than VREF, thereby indicating that node 16 needs to be programmed. The compare time is controlled by signal along H of controller 90 (FIG. 8). In summary, during the verify 1 mode of operation, the integration time of bit line 12 is increased from time T3 to time T4.

The foregoing steps are performed by controller 90 which may be implemented in hardware, software, or a combination of hardware and software. All the decision-making steps take place in controller 90, and the signals are generated for the next operation accordingly. Controller 90 is arranged to cause the generation of the various control signals shown in FIG. 4 and described previously. The connections to the signal paths have not been shown to avoid unnecessarily complicating FIG. 4.

Conductors 212 and 222 (FIG. 4) are connected to controller 90 as shown in FIG. 1. The signals on conductors 300, 302 and 304 are generated from the following signals supplied to the memory array.

As shown in FIG. 1, a voltage generator in the form of charge pump 320 is connected to controller 90 over a discharge line 321, an under V line 322 and a cp-vpp in line 324. The charge pump is used to generate operating voltages greater than the supply voltage for memory cell 10. Pump 320 generates a range of the operating voltages from a low voltage of 1.25V to a maximum voltage of 4.25V and transmits the operating voltages on one or more of lines 320–322—the terminals of cell 10 during erase and programming modes of operation in the manner described in connection with FIG. 1.

Controller 90 achieves adaptive programming duration and voltage levels, achieves increase cell reliability, hides complexity from users and minimizes charge pump peak current requirements.

Controller 90 includes a microprocessor or microcontroller that operates in response to a command set to control the operation of cell 10 and the memory array (not shown) in which cell 10 is located:

An Erase command erases a single memory location, such as cell 10;

An Erase_all command erases all the memory locations of the array, including cell 10;

A Program command programs a single memory location, such as cell 10;

A Program_all command programs all the memory locations of the array, including cell 10;

A Read command reads the value of a single memory location, such as cell 10.

The next command takes effect only when the current command is done, and busy flag has gone low.

Status bits report the current state of the controller (such as verify, read, and different charge pump levels.

In order to avoid excessive voltage across the gate of a transistor, such as transistors 60, 70 and 32 attached to node 16 (FIG. 1), the charge pump selected voltage on bus 324 is increased in steps of about 200 millivolts per step.

As previously explained, in the verify mode, the integration time is varied to control the sense margin of amplifier 170.

Controller 90 generates control signals in order to store a logical value in memory cell 10 followed by a verify stage using module 135. In order to store a predetermined logical value, controller 90 generates a control signal on bus 324 that causes charge pump 320 to generate its lowest operating voltage, e.g. 1.25V. The operating voltage is applied to terminals of memory cell 10 as previously described in connection with FIG. 1. Controller 90 then causes module 135 (FIG. 4) to verify the logical value stored in cell 10 as previously described. If the logical value was not stored, the operating voltage of pump 320 is increased by about 200 millivolts and the verify operation is repeated. The execution of commands by controller 90 ends by the occurrence of one of the following events:

1. Two consecutive successful verifications of the predetermined logical value by module 135; or 2. The operating voltage from charge pump 320 reaches its highest voltage level. If verification by module 135 is successful, the execution stops. If verification by module 135 is not successful, the execution stops without repeating.

High voltage circuits of pump 320 are switched one at a time by rippling techniques to minimize peak current requirement on pump 320. The rippling techniques are described as follows:

Each row of the memory array is accessed one at a time. Eraseall/programall is performed row by row.

Controller 90 also has an override mode in which the desired operating voltage level of pump 320 is selected from outside controller 90.

Figure 5:
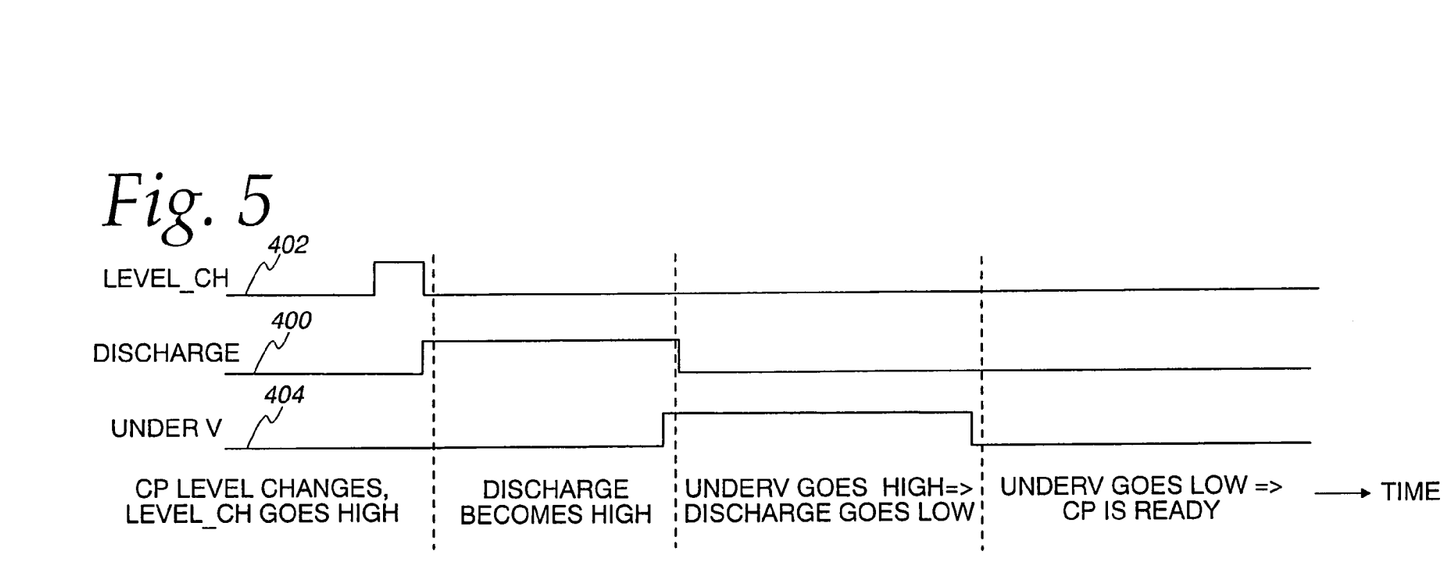
FIG. 5 is a waveform diagram illustrating exemplary control signals for controlling the charge pump shown in FIG. 1.

Referring to FIG. 5, controller 90 pulls a discharge signal 400 high on line 321. When the discharge signal 400 goes high, the operating voltage generated by charge pump 320 begins to discharge to a lower voltage. For example, during programming the Vp operating voltage on line 20 drops.

When the operating voltage Vp 20 drops below the selected value, signal UnderV 404 on line 322 goes high, which starts charge pump 320 charging up again. When the operating voltage reaches the desired value, determined by the cp_Vpp_in value on bus 324, signal discharge 400 goes low. After the selected operating voltage is reached, signal UnderV 404 goes low, indicating the selected operating voltage at the selected value and is ready for transmission to cell 10 on one or more of lines 20–22.

The controller pulls the discharge signal high each time the charge pump operating voltage changes. Each time the charge pump selected operating voltage value changes (i.e., each time the value of cp_vpp_in changes), the level_ch signal goes high. The discharge signal 400 starts to discharge the charge pump and therefore the operating voltage drops. When the operating voltage drops below the selected value by cp_Vpp_in, signal UnderV 404 goes high, which starts the charge pump to charge up again and discharge signal 400 goes low. Once the operating voltage reaches the value selected by cp_Vpp_in, the charge pump is ready, and underV signal 404 goes low.

UnderV can also go low during execution of a command. That means the value of the operating voltage has dropped from the value to which it was charged at the beginning of the execution.

Controller 90 frequently (every clock cycle) checks the value of the UnderV signal 404. It will go high each time the cp level changes (because controller goes up to a new cp_vpp_in value) or during an exection if the Vp deteriorates from the initial value. If signal UnderV 404 goes high, controller 90 interrupts the execution of the command, sets the level of the operating voltage (as explained before) and waits until the selected voltage is reached. When signal UnderV 404 goes low, controller 90 continues the execution of the command set from the point of interruption.

Controller 90 implements a read command in the manner previously described in connection with FIG. 1.

The operation of controller may be summarized as follows:

Charge Pump 320 generates a plurality of cell operating voltages varying in steps from a first voltage to a second voltage in response to a voltage control signal cp_Vpp_in from controller 90 on line 324, the first voltage being lower in value than the second voltage. Typical values for the first voltage are 1.25V. Typical values for the second voltage are 4.25V. A predetermined one of the logical values (e.g., a 1 or a 0) is stored in cell 10 when controller 90 causes pump 320 to generate on one or more of lines 20–22 a series of the operating voltages beginning with the first voltage and continuing with successively larger operating voltages greater the first voltage determined by the value of cp_Vpp_in. The series of operating voltages is transmitted to the cell 10. After each transmittal of one of the series of operating voltages, the voltage on bit line 12 is transmitted to amplifier 170. Controller 90 then determines whether the predetermined one of the logical values has been stored in the cell in response to the flow of charge. The transmittal of the series of operating voltages to cell 10 is terminated in the event that the predetermined one of the logical states has been stored or in the event that one of the series of successively larger operating voltages equals the second voltage. As a result, Controller 90 uses the lowest operating voltage that can successfully result in an erase or a programming operation.

While the invention has been described with reference to one or more preferred embodiments, those skilled in the art will understand that changes may be made and equivalents may be substituted without departing from the scope of the invention. For example, transistors 30 and 50 may be interchanged from the positions shown in FIG. 1. In addition, many modifications may be made to adapt a particular step, structure, or material to the teachings of the invention without departing from its scope. Therefore, it is intended that the invention not be limited to the particular embodiment disclosed, but that the invention will include all embodiments falling within the scope of the appended claims.

What is claimed is:

1. In a digital memory system including a memory cell arranged to store charge corresponding to a first logical value when the quantity of stored charge lies within a first range of values and corresponding to a second logical value when the quantity of stored charges lies within a second range of values, the cell being arranged to store a predetermined one of the first and second logical values in response to a range of operating voltages received by the cell, a system for controlling the logical value and the integrity of the data represented by the charge, comprising:

a bit line coupled to the cell;

a voltage generator arranged to generate a plurality of cell operating voltages varying in response to a voltage control signal; and a controller, wherein the controller generates the control signal, wherein the controller stores a predetermined one of the logical values in the cell by generating a series of the operating voltages, wherein the controller transmits the series of operating voltages, wherein the controller determines whether the predetermined one of the logical values has been stored in the cell in response to a voltage on the bit line, wherein the controller comprises a charge integrity estimating module, and wherein the controller determines whether the predetermined one of the logical values has been stored in the cell by initiating the operation of the charge integrity estimating module.

2. The system according to claim 1, wherein the charge integrity estimating module is operative during a first mode of operation to detect whether the quantity of the charge lies within the first range of values or the second range of values.

3. The system according to claim 2, wherein the charge integrity estimating module is operative during a second mode of operation to detect whether the quantity of the charge lies within a third range of values comprising a subset of the first range of values.

4. The system according to claim 3, wherein the charge integrity estimating module is operative during a third mode of operation to detect whether the quantity of the charge lies within a fourth range of values comprising a subset of the second range of values.

5. The system according to claim 4, wherein the third mode of operation is entered only if the quantity of the charges lies within the second range of values.

6. The system according to claim 4, wherein the controller causes the voltage on the bit line to be transmitted to the estimating module for variable time periods during the first mode of operation, the second mode of operation and the third mode of operation.

7. The system according to claim 6, wherein the time period during the second mode of operation is longer than the time period during the third mode of operation.

8. The system according to claim 3, wherein the second mode of operation is entered only if the quantity of charge lies within the first range of values.

9. The system according to claim 1, wherein the controller terminates the transmittal of the series of operating voltages to the cell in the event that the predetermined one of the logical states has been stored.

10. The system according to claim 1,
wherein the voltage generator is arranged to generate the plurality of cell operating voltages varying from a first voltage to a second voltage in response to the voltage control signal,
wherein the generated series of the operating voltages begins with the first voltage and continues with successively larger operating voltages greater than the first voltage, and
wherein the controller terminates the transmittal of the series of operating voltages to the cell in the event that one of the series of successively larger operating voltages equals the second voltage.

11. The system according to claim 1, wherein the controller determines whether the predetermined one of the logical values has been stored in the cell by having the estimating module confirm that the predetermined one of the logical values has been stored in the cell at least twice.

12. The system according to claim 1, wherein the voltage generator comprises a charge pump.

13. The system according to claim 1, wherein the controller causes the voltage generator to discharge below a selected one of the series of operating voltages and to increase to the selected operating voltage.

14. In a digital memory system including a memory cell arranged to store charge corresponding to a first logical value when the quantity of stored charge lies within a first range of values and corresponding to a second logical value when the quantity of stored charges lies within a second range of values, the cell being arranged to store a predetermined one of the first and second logical values in response to a range of operating voltages received by the cell, a method for controlling the logical value and the integrity of the data represented by the charge, comprising:
(a) generating a plurality of cell operating voltages varying in response to a voltage control signal;
(b) storing a predetermined one of the logical values in the cell by generating a series of the operating voltages;
(c) transmitting to the cell the series of operating voltages; and
(d) determining whether the predetermined one of the logical values has been stored in the cell, the determining comprising detecting during a first mode of operation whether the quantity of the charge lies within the first range of values or the second range of values and detecting during a second mode of operation whether the quantity of the charge lies within a third range of values comprising a subset of the first range of values.

15. The method according to claim 14, comprising:
terminating transmittal of the series of operating voltages to the cell in the event that the predetermined one of the logical values has been stored.

16. The method according to claim 14,
wherein generating a plurality of cell operating voltages varying in response to a voltage control signal comprises generating the plurality of cell operating voltages varying from a first voltage to a second voltage in response to the voltage control signal, and
wherein storing a predetermined one of the logical values in the cell by generating a series of the operating voltages comprises storing the predetermined one of the logical values in the cell by generating the series of the operating voltages beginning with the first voltage and continuing with successively larger operating voltages.

17. The method according to claim 16, comprising:
terminating transmittal of the series of operating voltages to the cell in the event that one of the series of successively larger operating voltages equals the second voltage.

18. The method according to claim 14, wherein the determining comprises detecting during a third mode of operation whether the quantity of the charge lies within a fourth range of values comprising a subset of the second range of values.

19. The method according to claim 18, wherein the third mode of operation is entered only if the quantity of the charges lies within the second range of values.

20. The method according to claim 18, wherein the detecting comprises sensing a voltage responsive to the charge for variable time periods during the first mode of operation, the second mode of operation and the third mode of operation.

21. The method according to claim 20, wherein the time period during the second mode of operation is longer than the time period during the third mode of operation.

22. The method according to claim 14, wherein the second mode of operation is entered only if the quantity of charge lies within the first range of values.

23. The method according to claim 14, wherein determining whether the predetermined one of the logical values has been stored in the cell comprises confirming that the predetermined one of the logical values has been stored in the cell at least twice.

24. The method according to claim 14, wherein generating a plurality of cell operating voltages varying in response to a voltage control signal comprises charge pumping.

25. The method according to claim 14, wherein generating a plurality of cell operating voltages varying in response to a voltage control signal comprises discharging below a selected one of the series of operating voltages and increasing to the selected operating voltage.

* * * * *